United States Patent [19]

Kraemer

[11] Patent Number: 4,590,617
[45] Date of Patent: May 20, 1986

[54] HERMETICALLY SEALED PLANAR STRUCTURE FOR HIGH FREQUENCY DEVICE

[75] Inventor: Erich H. Kraemer, Clearwater, Fla.

[73] Assignee: Sperry Corporation, New York, N.Y.

[21] Appl. No.: 574,824

[22] Filed: Jan. 30, 1984

[51] Int. Cl.⁴ .................. H04B 1/26; H01L 23/02; H05K 5/00

[52] U.S. Cl. .................. 455/328; 174/52 FP; 357/74; 455/330

[58] Field of Search ........... 455/327, 325, 328, 330, 455/81; 357/74; 174/52 S, 52 FP; 361/399

[56] References Cited

U.S. PATENT DOCUMENTS

| | | | |
|---|---|---|---|
| 4,126,758 | 11/1978 | Krumme | 174/52 FP |
| 4,276,655 | 6/1981 | Kraemer et al. | 455/327 |
| 4,331,258 | 5/1982 | Geschwind | 174/52 FP |
| 4,390,220 | 6/1983 | Benasutti | 174/52 FP |
| 4,412,354 | 10/1983 | Hu | 455/328 |
| 4,427,991 | 1/1984 | Yamamjia et al. | 357/74 |
| 4,506,108 | 3/1985 | Kersch et al. | 357/74 |

Primary Examiner—Jin F. Ng
Assistant Examiner—Curtis Kuntz
Attorney, Agent, or Firm—Howard P. Terry; Arnold L. Albin

[57] ABSTRACT

A hermetically sealed quasi-planar integrated circuit suitable for millimeter-wave transmission. The circuit is enclosed within a module having a metal frame soldered to a quartz window. Active elements, such as beam-lead diodes, are mounted on a conductive layer housed within the frame. The assembly is evacuated and may be filled with an inert gas to avoid condensation in humid operating conditions. The invention is particularly adaptable to use in a cross-bar signal mixer at frequencies up to 140 GHz. The structure is adaptable to cooling to reduce circuit losses and improve performance and operating efficiency. Resonant cavities are provided to permit tuning the mixer to fixed frequencies.

27 Claims, 14 Drawing Figures

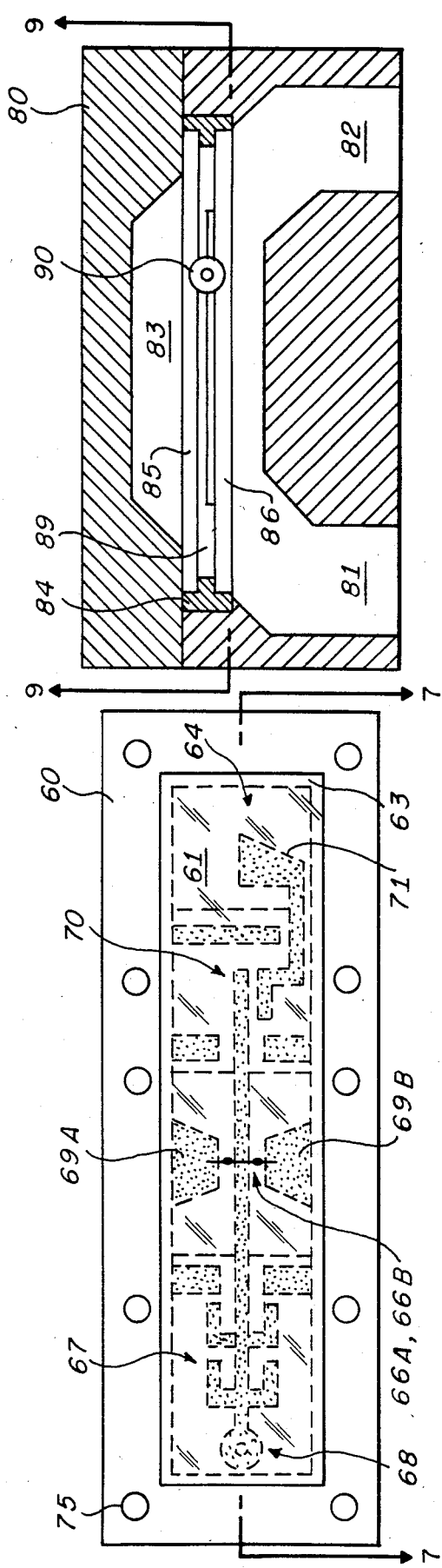
FIG.6.
FIG.7.
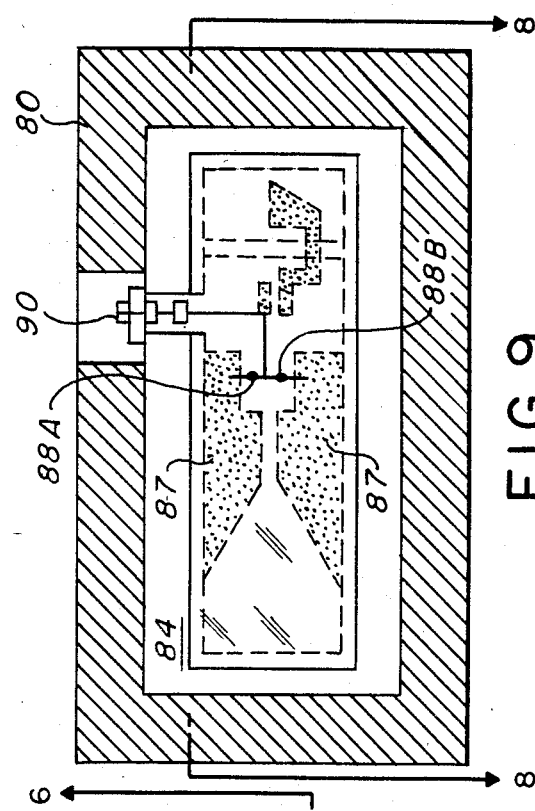
FIG.8.
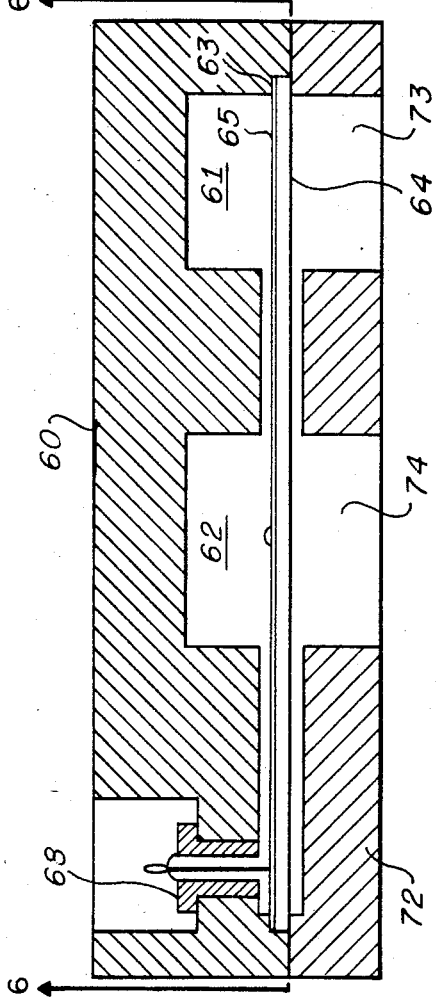
FIG.9.

HERMETICALLY SEALED PLANAR STRUCTURE FOR HIGH FREQUENCY DEVICE

BACKGROUND OF THE INVENTION

1. Field of the Invention

The invention relates to active devices for high frequency applications, and more particularly to quasi-planar signal processing structures such as mixers in which the entire circuit is disposed in a hermetically sealed module.

2. Description of the Prior Art

In general, active high frequency devices, especially those designed to operate with carrier signals above 30 GHz, have been built in waveguide cavities in order to minimize losses and to permit incorporation in the structures of necessary filters. But when constructed integrally with other receiver components, the arrangement of the various interconnecting waveguides has presented formidable problems barring achievement of fully acceptable cost, package size, and system bandwidth, as well as of sufficiently low losses.

In U.S. Pat. No. 4,276,655 issued June 30, 1981 to E. H. Kraemer and John C. Rolfs, and assigned to the assignee of the present invention, a cross-bar signal mixer is disclosed that comprises a balanced planar section supported upon a dielectric substrate placed across the carrier and local oscillator waveguides perpendicular to the direction of electromagnetic energy propagation. Beam lead mixer diodes are connected across the feed point of a taper matching section. In this embodiment, the planar mixer included a substrate containing the mixer diodes mounted perpendicular to the direction of propagation of the signal-input frequency.

In a fin-line structure described by P. J. Meier in U.S. Pat. No. 3,825,863, issued July 23, 1974, a mixer comprised of a waveguide with a longitudinal film conductor is supported on a dielectric substrate within the guide, using beam-lead diodes mounted on the substrate.

The effectiveness of the preceding mixer circuits at millimeter wavelengths is impaired by stray circuit capacitance. While the beam lead diode performs adequately at frequencies as high as 100 GHz, the passivation of such diodes agains contaminants and, in particular, sodium ions, is difficult due to the necessity of minimizing stray shunt capacity. Stray capacitance as high as 0.03 pF or greater, while acceptable at Ka band, would greatly increase the conversion loss at higher millimeter frequencies (as, for example, above 60 GHz). The result is to increase conversion loss at 100 GHz from a typical value of 4.5 db at a stray capacitance of 0.015 pF to approximately 8 dB for a stray capacitance of 0.035 pF for a fully passivated beam-lead diode. Passivation with silicon dioxide ($SiO_2$) has been successfully applied to mixer diodes of the beam-lead type up to 140 GHz, where noise figures of 6.0 dB (double sideband) have been achieved. However, $SiO_2$ is particularly susceptible to invasion by sodium ions, as would be encountered in a saltwater atmosphere. Further, gallium arsenide (GaAs) as used for interconnections in a beam-lead diode is highly susceptible to invasion by moisture, thereby resulting in degraded performance if operation in a humid atmosphere is required. Effective passivation by a sodium ion resistant insulator such as silicon nitride ($Si_3N_4$) results in a substantial increase in stray capacitance and, consequently, unacceptable conversion losses. Thus, the beneficial properties of silicon nitride in providing more resistance to ionic contamination than silicon dioxide cannot be utilized. In consequence, the prior art has attempted to provide hermetic sealing of the susceptible devices.

This has heretofore been accomplished by enclosing the entire diode in a hermetically sealed ceramic case. This leads adversely to a higher stray shunt capacity and additional losses due to the ceramic case, and thus reduces the conversion efficiency of the mixer (i.e., increased conversion loss and noise figure). The use of a sealed module housing the active mixer elements and associated circuit has not heretofore been reported. Beneficially, the use of a sealed module reduces the losses since the sealing windows have a larger surface area and, therefore, a reduced current density and consequent lower losses. In addition, its stray reactance can more readily be tuned-out with low loss by proper choice of the window size and thickness. The approach described will also provide wider bandwidth than circuits which attempt to match out the parasitic reactances of a ceramic cased mixer diode.

SUMMARY OF THE INVENTION

According to the invention, a hermetically planar integrated circuit is formed by providing a conductive frame having an aperture therein for supporting a dielectric substrate transparent to radio frequencies on which is deposited a conductive layer or printed circuit. A discrete component, which may be a mixer diode, is coupled to the conductive layer. The diode may also be formed by appropriate metallic deposition and doping of an epitaxial layer grown on the substrate. Radio frequency energy is coupled through the transparent dielectric substrate to impinge upon the printed circuit, which is suitably proportioned to couple a portion of the radio frequency energy to the component thereon, thereby permitting the component to interact with the radio frequency energy and provide an output at a suitable frequency. The frame and dielectric substrate are soldered in the manner described below to provide a gas-tight hermetically sealed chamber, enclosing the component and conductive layer. The circuit thus enclosed comprises a module which is adaptable to other circuit configurations such as an amplifier or frequency multiplier as well as a balanced mixer. Suitable contacts are provided for connection to a supporting structure which may include one or more conventional waveguides for supplying radio frequency energy at selected frequencies, and tuned cavities associated with the conductive layer to enhance the conversion efficiency.

Thus, the invention overcomes the prior art problems, is versatile, and is useful in a variety of types of circuit configurations adapted to planar structures. The hermetically sealed chamber provides protection from contaminants that would otherwise penetrate the limited passivation that may be applied without performance degradation at millimeter frequencies; provides protection of fragile beam-lead diodes against damage in handling and assembly; eliminates the effects of moisture condensation due to changing humidity conditions; and provides a ready means of replacing the sealed circuit under field conditions. Other embodiments are provided wherein the module utilizes a plurality of transparent dielectric windows soldered to the frame to permit predetermined tuning of the assembly by means of an auxiliary cavity resonator, applications to fin-line structures in waveguides, and an embodiment permitting cryogenic cooling of the active element to provide improved operational performance.

BRIEF DESCRIPTION OF THE DRAWINGS

FIG. 6 is a front elevation view of a second fixed-tuned embodiment of the invention, taken along the line 6—6 of FIG. 7.

FIG. 7 is a plan view in cross-section taken along the line 7—7 of FIG. 6.

FIG. 8 shows a bent waveguide fin-line embodiment of the invention in a plan view section taken along the line 8—8 of FIG. 9.

FIG. 9 is an elevation view in cross-section taken along the line 9—9 of FIG. 8.

DESCRIPTION OF THE PREFERRED EMBODIMENTS

Figure 1:
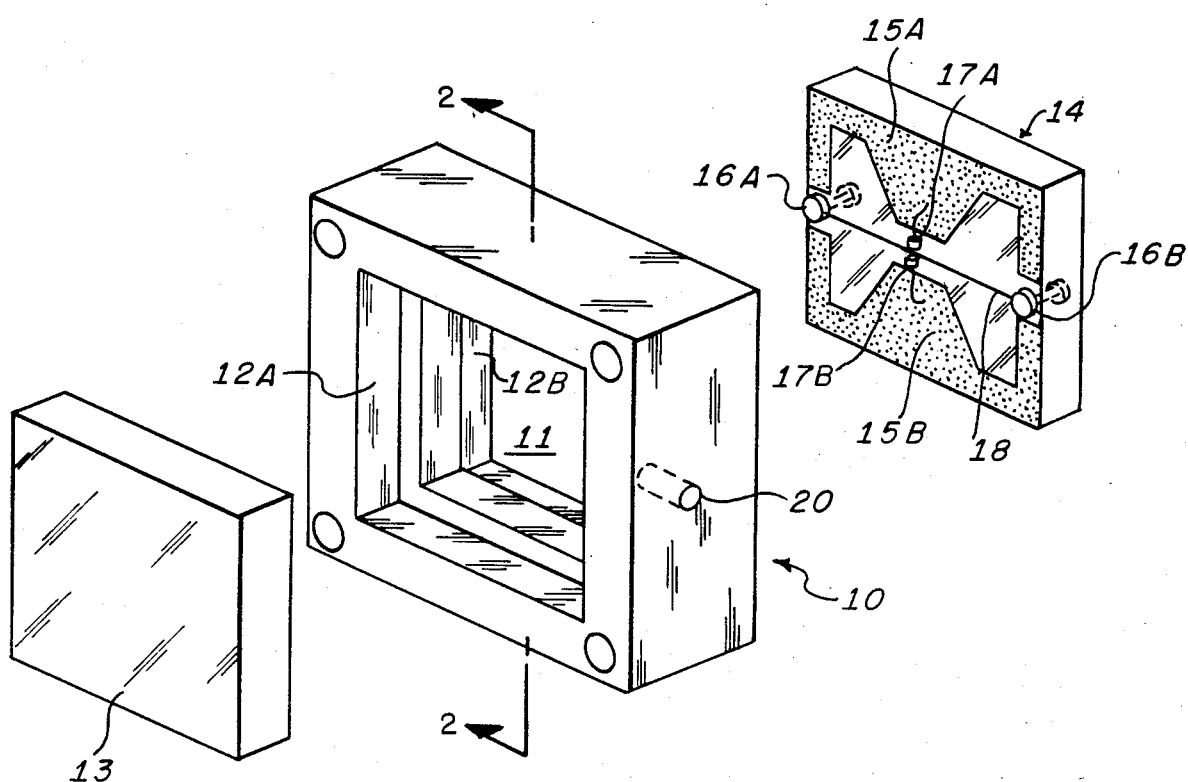
FIG. 1 is an exploded perspective view of a first embodiment of the invention for use as a module in a tunable cross-bar mixer.

Referring to FIG. 1, in which the features have been exaggerated for clarity, an electrically conductive frame 10 is provided with an aperture 11 having recesses 12A and 12B for supporting windows 13 and 14, respectively. Windows 13 and 14 are formed of a planar dielectric material, such as quartz, that is substantially transparent to radio frequency energy. The inner surfaces of the windows are preferably aligned in parallel planes by the mounting recesses 12A and 12B. The inner surface of window 14 supports conductive layers 15A and 15B which are formed of electrically conductive material such as copper foil. Layers 15A and 15B support at least one discrete circuit element 17A, which may be a beam lead diode or other discrete component. In a preferred embodiment, a second discrete circuit element 17B is supported by layer 15B. In a cross-bar mixer, a further film conductor 18 is symmetrically disposed on window 14 between layers 15A and 15B for contact to discrete circuit elements 17A and 17B and electrical contacts 16A and 16B.

Figure 2:
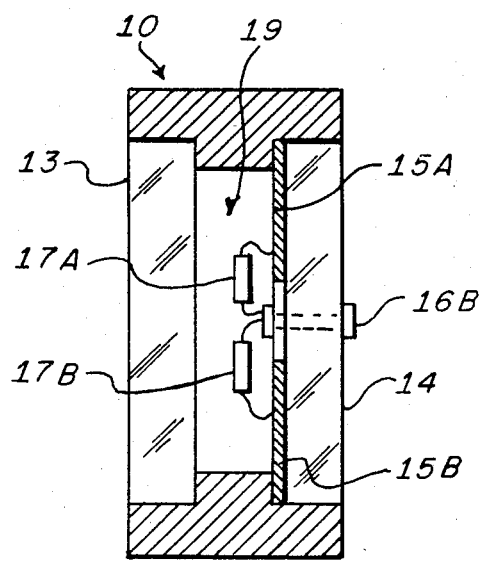
FIG. 2 is an elevation view in cross-section taken along the line 1—1 of FIG. 1.

Preferably, the aperture 1 will be symmetrically disposed within frame 10 with dielectric window 13 spaced a predetermined distance from dielectric window 14. As shown in FIG. 2, the frame 10, first dielectric window 13, and second dielectric window 14 with conducting film layers 15A and 15B deposited thereon are assembled to form a chamber 19 enclosing discrete components 17A and 17B. Windows 13 and 14 are thereupon soldered to frame 10 to form a gas-tight seal. The chamber is then evacuated through port 20 which is thereafter sealed off in the conventional manner. An inert gas may also be introduced through port 20 after the air has been removed. The assembly then provides a hermetically sealed structure for the protection of components 17A, 17B which is adaptable to a variety of radio frequency circuit applications. Contact to external supporting circuitry is provided by means of electrical contacts 16A and 16B.

Achieving a successful quartz to metal hermetic solder seal requires the use of materials that are thermally compatible and solderable. One method consists of sputter deposition of a nichrome bond layer followed by copper or gold sputter deposit on the surfaces of the quartz that are to be joined. An additional electroplating of copper or gold provides added thickness for the soldering operation. The associated metal frame, which is preferably comprised of stainless steel, may be gold-plated to provide a solderable surface. Successful seals have been achieved using solders such as pure tin, tin-lead, indium, indium alloys, and gold-tin. Other techniques such as laser welding are also suitable.

Figure 3:
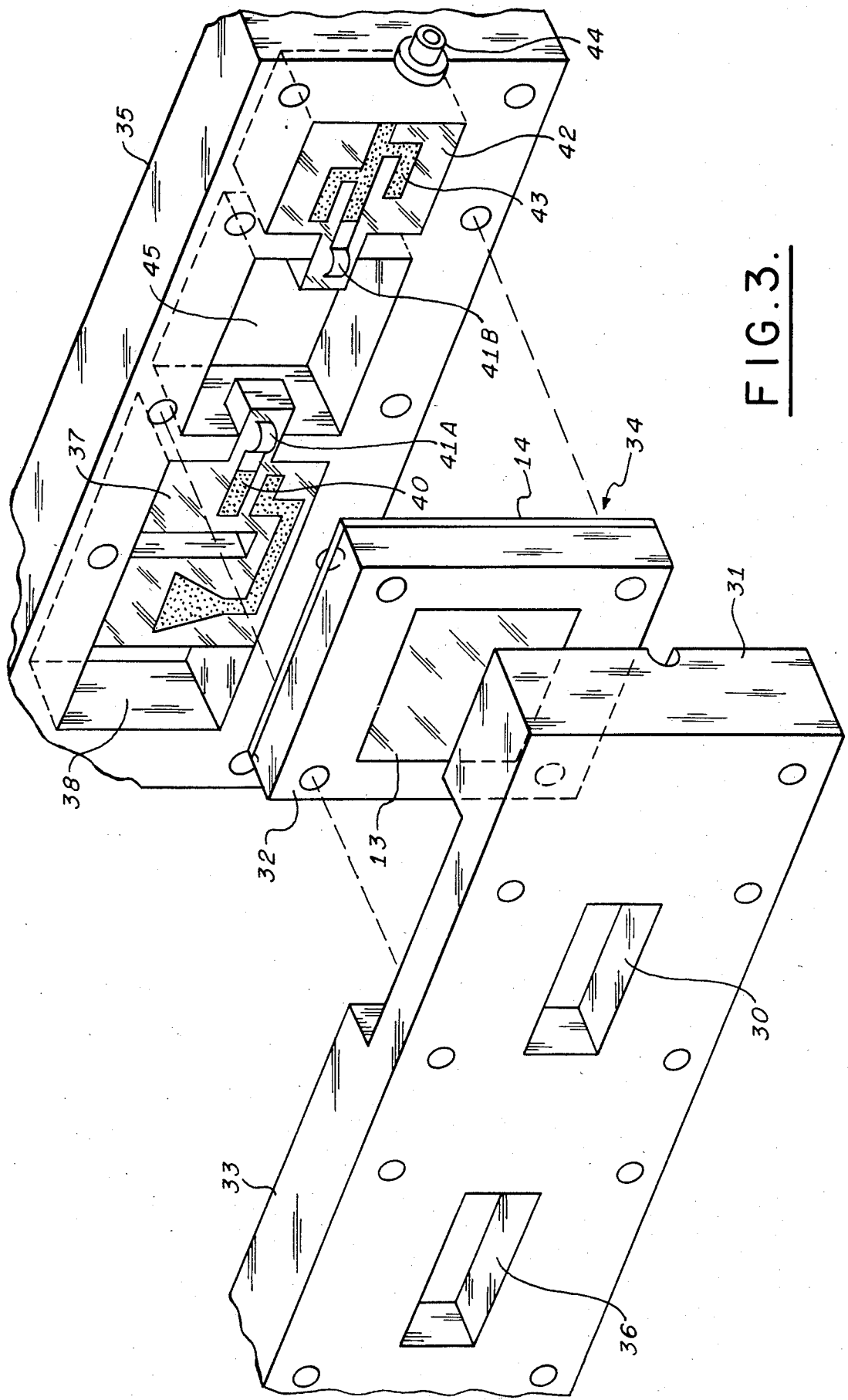
FIG. 3 is an exploded perspective view of the embodiment of FIG. 1 in a cross-bar mixer test assembly.

FIG. 3 shows the aforementioned embodiment of the invention as applied to a cross-bar mixer. The configuration shown may be used, for example, as a test fixture for evaluating the radio frequency and DC characteristics of the hermetically sealed module. Radio frequency energy from an external signal is applied to wavegude 30, defined by a suitably shaped aperture in a guide block 31. The hermetically sealed module 32 is received by a groove in guide block 31 with planar dielectric window 13 facing the signal source. The outer surface of dielectric 14 is aligned with the inner surface 33 of guide block 31. If desired, a soft copper compressible gasket 34 may be superposed on the outer face of dielectric 14 for assuring electrical continuity with support block 35. A second aperture 36 may also be formed in guide block 31 for propagating a radio frequency signal at a second frequency such as the local oscillator of a mixer.

A support block 35 has mounted thereon a first substrate 37 transparent to radio frequencies. A resonant cavity 38 is formed by a rectangular bore in support block 35. The inner face of substrate 37 has deposited thereon a conductive layer which may include a probe 39 for receiving the local oscillator signal, having a planar taper for impedance matching and an integral capacitive element 40 for coupling to electrical contact 41A. Contact 41A engages contact 16A of the module. A further planar dielectric substrate 42 is mounted on support block 35 for receiving the output of a second contact 41B for engaging with electrical contact 16B of the module, and providing a signal, which may be an intermediate-frequency product of the mixer, to circuit 43, which may comprise a band pass filter, and thence to output terminal 44. A second tuned cavity 45 may be provided in support block 35 in registration with the sealed module.

In operation, referring again to FIG. 1 with continued reference to FIG. 3, the carrier signal is supplied by waveguide 30 which couples radio frequency energy through window 13 to the gap between conductive layers 15A and 15B. The latter, which define a planar taper, perform jointly as an impedance matching transformer for transforming the guide impedance in a broadband manner down to the impedance required to match the discrete components mounted thereon, as for example, mixer diodes 17A and 17B. Signal energy leaking past the mixer diodes is reflected from the tuned cavity 45 in the support block 35 behind the hermetically sealed module 32. Local oscillator energy is applied separately through waveguide input 36 to the plane of the local oscillator coupling window 37, which is perpendicular to the direction of propagation of energy into the mixer. The fan-shaped monopole pickup element 39 formed of a conductive layer couples the local oscillator energy to spring contact 41A through capacitive coupling filter 40. Any local oscillator energy leaking past the local oscillator probe is again reflected by the conducting face of tuned cavity 38 back to the probe 39. Cavities 38 and 45 are tuned to the local oscillator and input carrier frequency, respectively. By changing the depth of the cavity behind the mixer windows, the device can be tuned to selected frequencies within the waveguide band of operation. The local oscillator signal is coupled through contact 41A to contact 16A of the module into the common junction of cross-bar conductor 18 and the mixer diodes 17A and 17B. After mixing the local oscillator signal with the carrier frequency signal, the intermediate frequency energy is coupled away from the common junction of the mixer diodes by the continuation of the cross bar conductor 18 in a direction opposite to that of the local oscillator input probe. The output energy is extracted through contacts 16B and 41B to RF filter 43 which prevents any undesired frequency components from propagating into the intermediate frequency output 44. The above principle of operation is described in great detail in the aforementioned U.S. Pat. No. 4,276,655.

Figure 4:
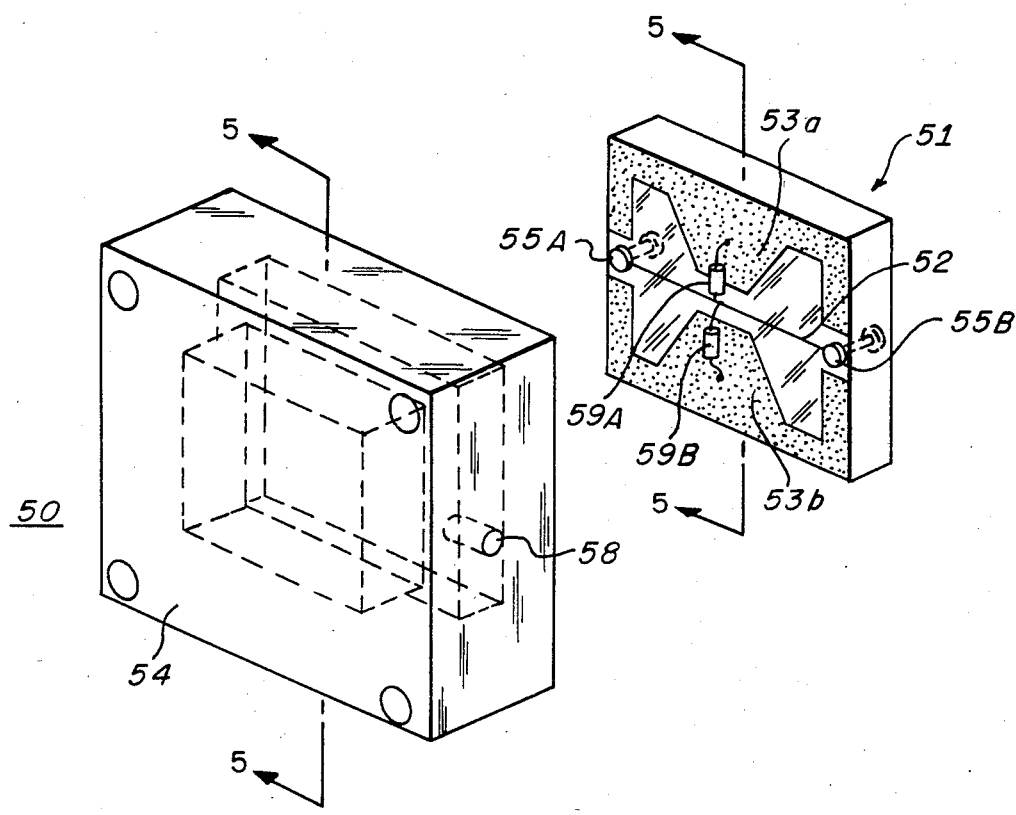
FIG. 4 is an exploded perspective view of a fixed-tuned module embodiment of the invention.

The alternative embodiment of FIG. 4 is similar in general to that of FIGS. 1 through 3, with the major distinction that a hermetically sealed module 50 is adapted to receive a single dielectric substrate 51 on the inner-face of which a cross bar film conductor 52 and conductive substrates 53A and 53B are disposed. This embodiment is applied for fixed-tuned applications, where the frame 54 also serves as a support block for substrate 51, the mixer substrate serving as the window to hermetically seal the structure. The outer face of substrate 51 would be coupled to the waveguide signal frequency input, while connections to the local oscillator input and intermediate-frequency output would be made through contacts 55A and 55B, respectively.

Figure 5:
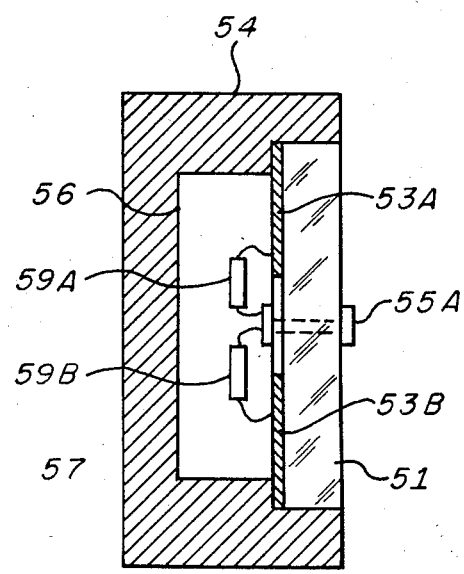
FIG. 5 is an elevation view in cross-section taken along the line 5—5 of FIG. 4.

As noted in FIG. 5, the inner rear wall 56 of frame 54 serves as a reflecting surface for cavity 57 so that module 50 provides a hermetically sealed tuned structure suitable for a predetermined operating frequency. The module may be evacuated or filed with an inert gas through port 58. Mixer diodes 59A and 59B are symmetrically disposed on substrate 51 with respect to conductive substrates 53A and 53B and cross-bar conductor 52.

A further alternate embodiment shown in FIGS. 6 and 7 is similar in general to that of FIG. 4 except that the structure for receiving the RF carrier and local oscillator signal and providing the intermediate-frequency output is provided in an integrated module. In consequence, both the IF filter and local oscillator coupling components are included within the hermetically sealed structure. The structure of FIG. 6 includes a support block 60 having a cavity 61 tuned to reflect the local oscillator frequency and a cavity 62 tuned to reflect the signal frequency. The support block 60 has an thin rectangular recess 63 at its outer surface for accommodating planar dielectric substrate 64. A printed circuit 65 is deposited on the inner surface of substrate 64 for energizing discrete components 66A and 66B, which may be mixer diodes, and for extracting the intermediate frequency signal through filter 67 to provide an output signal at hermetically sealed connector 68. FIG. 6 also shows in phantom view the tapered impedance matching sections 69A and 69B, local oscillator coupling capacitor 70, and local oscillator coupling monopole 71.

Referring to FIG. 7, the structure is seen to include an input end piece 72 including a waveguide 73 for the local oscillator input and a waveguide 74 for the signal frequency input. If substrate 64 is made of quartz and support block 60 is made of plated stainless steel, the two components may be joined together as described above to form a hermetically sealed unit enclosing the mixer circuitry. Chambers 61 and 62 may be evacuated through a soldered sealed exhaust port at the IF output connector 68, which may comprise a hermetic-type glass feed-through terminal. The structure comprising the hermetically sealed module and end piece 72 may be clamped together using screws (not shown) through bores 75.

In operation, a carrier signal is supplied by waveguide 74 which couples the signal energy to the impedance matching mixer circuitry 69A, 69B of printed circuit 65. Cavity 62 serves to reflect any energy leaking past the circuit board back to the conductive substrate. Local oscillator energy is supplied separately through waveguide input 73 where the energy impinges upon pickup probe 71. Probe 71 couples the local oscillator energy to the balanced crossbar transmission line 76. Any local oscillator energy leaking past local oscillator probe 71 is reflected by the conducting face of cavity 61. The local oscillator signal is then coupled through a capacitor 70 into the common junction of transmission line 76 and discrete components 66A and 66B. After interaction with the carrier frequency signal in the discrete components 66A and 66B, the resultant energy product is coupled through filter 67 to output connector 68. Filter 67 prevents any undesired frequency components, which may, for example, be mixer by-products, from appearing at the intermediate-frequency output.

A modified version of the hermetically sealed module which is adaptable to a fin-line waveguide is shown in FIGS. 8 and 9. In order that the supporting frame should not disturb the fields supplying the input signal and local oscillator energy, the module may be installed in a bent waveguide with the frame members integral with the walls of the guide. Thus, as shown in FIG. 8, a support block 80 is provided with aperture 81 for receiving an input carrier signal, aperture 82 for receiving a local oscillator signal, and a longitudinal section 83 for propagating the mixer signal components. A frame 84 is integrally mounted in the walls of the support block 80 whereby it does not disturb fields propagating therein. Inner window 85 and outer substrate 86, comprised of a dielectric material such as quartz, are soldered to the conductive metal frame 84 before assembly into support block 80. A printed circuit 87 and discrete components 88A and 88B, which may comprise active elements such as mixer, multiplier or noise diodes, are installed in the cavity 89 formed by the inner and outer windows and the frame. The cavity is evacuated in the usual manner through hermetically sealed connector 90, which provides the output signal.

The operation is similar to that of FIGS. 6 and 7, except that the mixer circuit is parallel to the propagating path of the carrier and local oscillator signals, which is characteristic of a fin-line structure, rather than perpendicular to the direction of propagation of energy into the device, as in the earlier embodiments.

Figure 11:
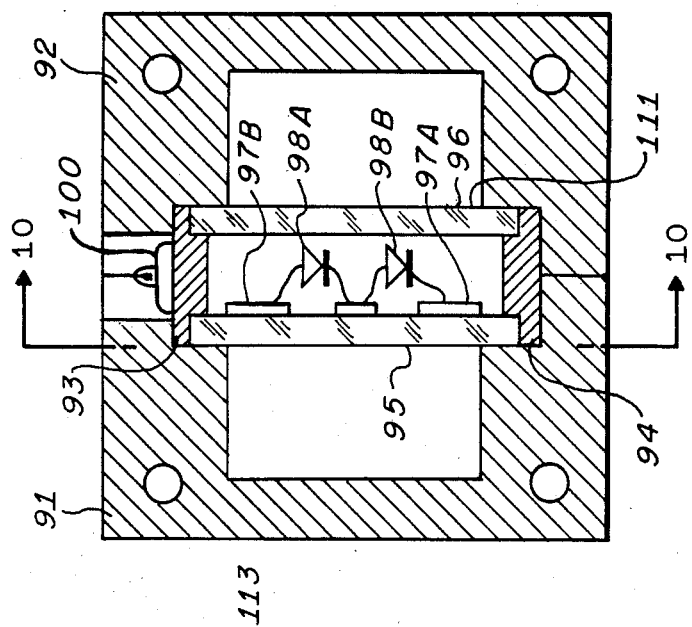
FIG. 11 is an elevation view in cross-section of the embodiment of FIG. 10 taken along the line 11—11 of FIG. 10.
Figure 10:
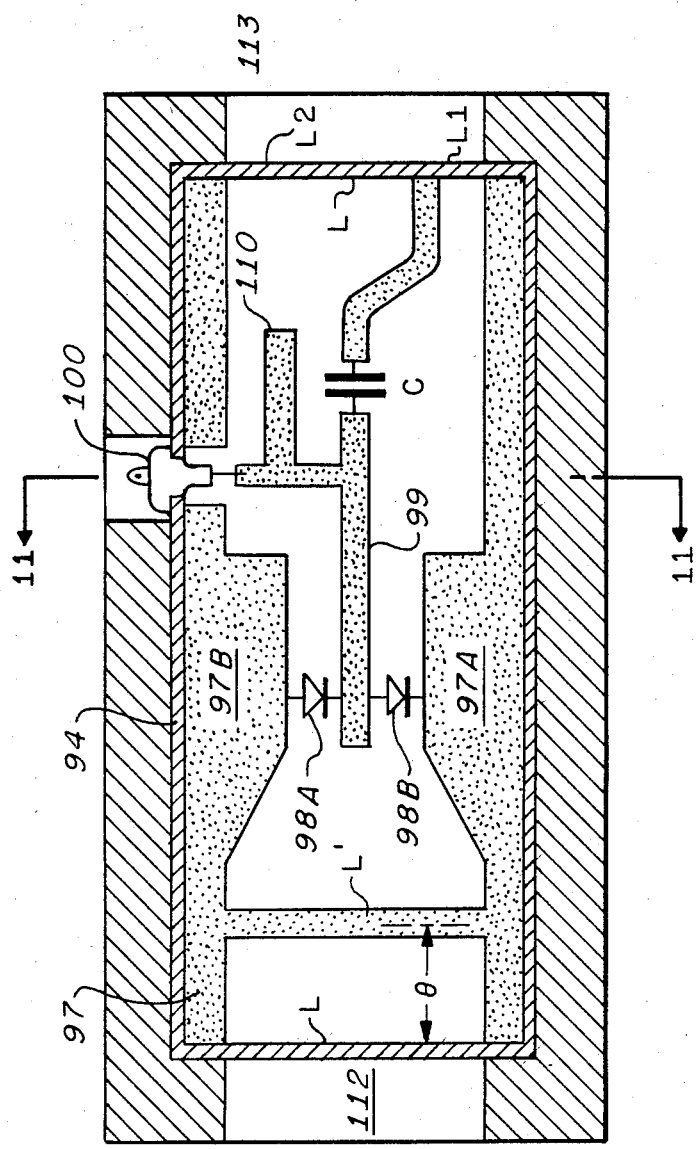
FIG. 10 is an elevation view in cross-section of an in-line fin-line embodiment of the invention taken along the line 10—10 of FIG. 11.

An alternate embodiment of the invention suitable for a fin-line structure with in-line signal and local oscillator inputs is shown in FIGS. 10 and 11. Symmetrically disposed support blocks 91 and 92 are formed from a material of suitable electrical conductivity, and machined with a narrow rectangular recess 93 for receiving frame 94. Frame 94, which may be formed of stainless steel or other metal with a plating to improve conductivity and solderability, in turn supports dielectric windows 95 and 96 spaced apart and parallel, constituting module 111. A printed circuit 97 including positions 97A, 97B is deposited on the inner surface of one of the windows to define the coupling electrodes. Mounted on the printed circuit 97 are discrete components 98A and 98B which may be, for example, active components such as diodes for use in a mixer, multiplier, or noise generating circuit. A crossbar element 99 extends from the junction of the discrete components to a coupling capacitor C, and to an output connector 100. Connector 100 is adapted for evacuating the hermetically sealed chamber formed by soldering windows 95 and 96 to frame 94. An I-F filter 110 is interposed between the crossbar transmission line 99 and connector 100 in the conventional manner. Also shown in FIG. 10 are inductances L and L' defined by portions of printed circuit 97, whose functions will be described below.

The operation of this embodiment is similar to that described above with respect to FIGS. 8 and 9 except that the carrier signal and local oscillator signal are longitudinally propagated through waveguides 112 and 113, respectively, longitudinally aligned with the module 111 and thus parallel to the printed circuit 97. In the conventional fin-line structure, no conductive elements are permitted parallel to the electric field within the walls of the guide, since such elements would result in gross disturbances of the field distribution and mismatching to the guide. However, by introducing additional inductive elements suitably phased with respect to the inductance introduced by the frame members which parallel the electric field, a resonant circuit may be formed which has the effect of matching the frame members to the incoming energy. Thus, referring again to FIG. 10, if the portion of the frame 94 receiving signals 112 from the carrier has an inductance L, an additional inductance L' defined by a portion of the printed circuit 97 may be introduced at a phase displacement O to have the desired effect. This technique is described more fully in Y. Konishi, 12-GHz-BAND FM RECEIVER FOR SATELLITE BROADCASTING, IEEE Trans. MTT, 26, No. 20, Oct. 1978. Similarly, the frame inductance L at the intermediate-frequency end may be utilized by tapping the frame to provide matching inductances L1 and L2 for coupling to cross-bar element 99.

Figure 13:
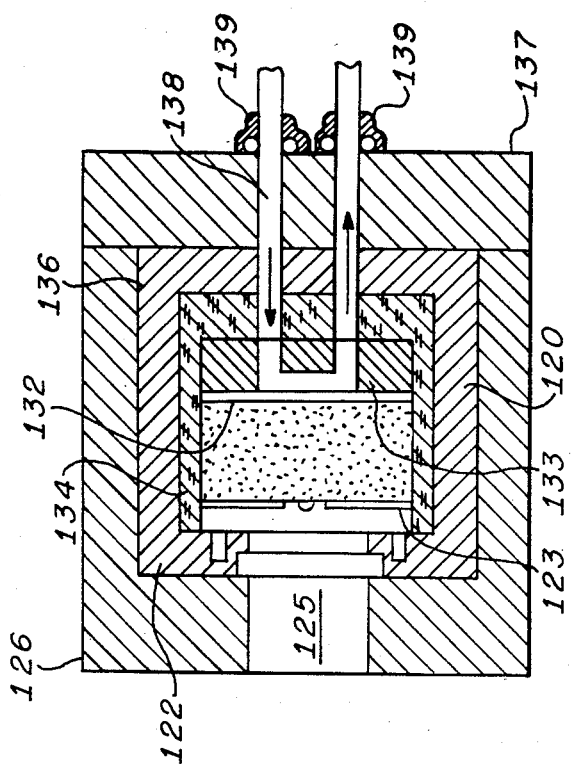
FIG. 13 is an elevation view in cross-section taken along the line 13—13 of FIG. 12.
Figure 12:
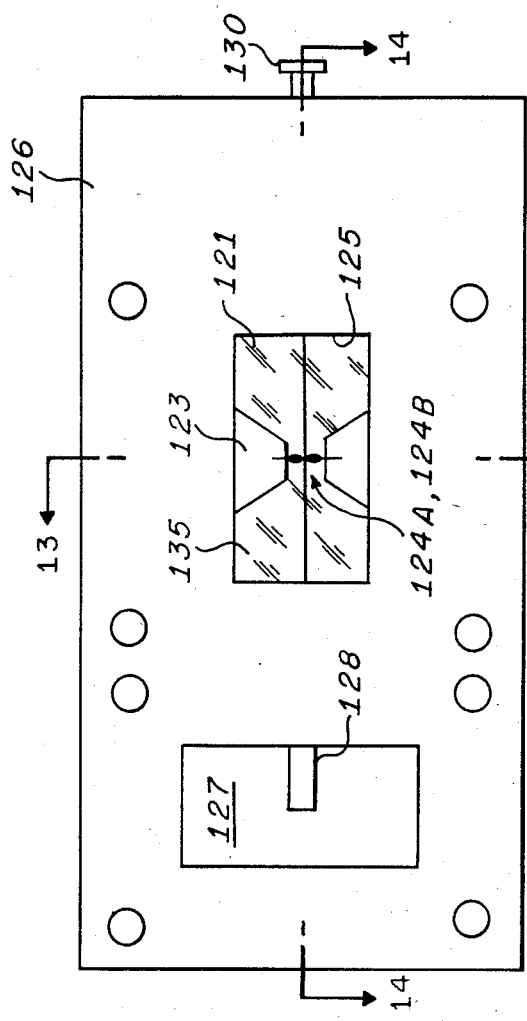
FIG. 12 is an elevation view in cross-section of an embodiment of the invention adapted for cryogenic cooling.
Figure 14:
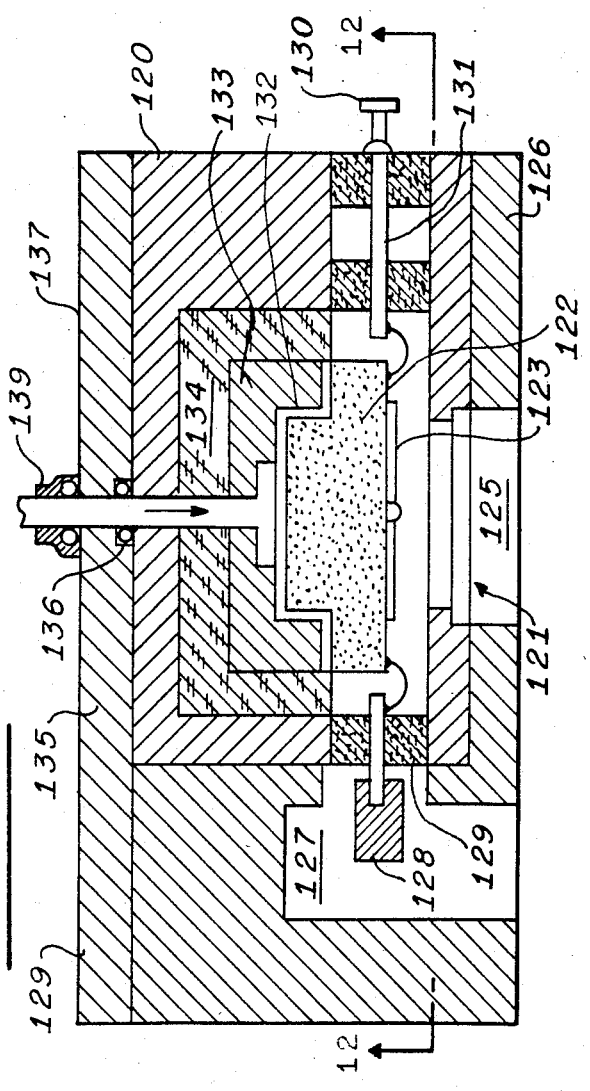
FIG. 14 is a plan view in cross-section taken along the line 14—14 of FIG. 12.

The hermetically sealed module is particularly adaptable to providing an ultra-low-noise cryogenically cooled active circuit which does not require an unweldy cryostat normally required for such circuits in immediate proximity to the active elements. FIGS. 12–14 show such an embodiment. A metal support block 120 which may be formed of stainless steel, ahs provision for receiving a planar dielectric window 121, such as quartz. Facing the planar dielectric window and also mounted within the support block is a thermally conductive dielectric substrate 122 which may be comprised of alumina. Disposed on the thermally conductive substrate and facing the inner surface of the planar dielectric window is a first electrically conductive layer 123. Layer 123 consists of a printed circuit such as the crossbar mixer type heretofore described, having active elements such as mixer diodes 124A and 124B mounted and electrically connected thereto. Signals from a radio frequency carrier source are propagated through waveguide 125 defined in input block 126 for propagation through window 121 and printed circuit 123 to active elements 124A and 124B. A second cavity 127 in input block 126 provides a signal from a local oscillator source to a probe 128 which is coupled through hermetic seal 129 to the crossbar element of layer 123. The output signal from the crossbar element feeds connector 130 through hermetically sealed filter 131.

A second layer 132 of electrically conductive material is plated or printed on the rear opposing face of dielectric substrate 122 thereby defining a reflector for redirecting stray energy transmitted from cavity 125 so as to reflect such energy back to electrically conductive layer 123 wherein the active components are mounted. It will be appreciated that dielectric substrate 122 must be dimensioned in the conventional manner so that reflector 132 provides a cavity tuned at the desired carrier frequency. A heat sink 133, which may be comprised preferably of copper, is disposed in intimate contact with thermally conductive dielectric substrate 122 and its reflecting surface 132. The heat sink desirably provides a thermal match for efficiently permitting withdrawal of heat from substrate 122. Confined between the exposed surface of heat sink 133 and support block 120 is a layer of insulating material 134, which may be comprised of cork, foam encapsulant, or other suitable material of low thermal conductivity. A gas tight chamber for enclosing the active components is created by hermetically sealing the active components within the module. This may be accomplished as explained heretofore by soldering the quartz substrate 121 to support block 120 along the periphery 135, in combination with the hermetically sealed connections at 129 and 130. Glass-to-metal solder seals of the conventional type may be utilized for the electrical connections.

An end plate 137 is bolted to support block 120 and input block 126 to complete the assembly. A pair of holes 138 for circulating a coolant through the module is bored in end plate 137, support block 120, insulator 134, and heat sink 133. The bore may be expanded as shown in FIG. 14 to provide improved heat transfer with thermally conductive substrate 122. Rubber O-rings 136 may be used at the interface of end plate 137 and support block 120 to prevent loss of the coolant, but a hermetic seal need not be obtained, since the replaceable active module is integrally sealed.

In operation, a refrigerant is introduced either through an open or closed loop refrigeration system into one of the bores 138. The active elements 124A and 124B which may be, for example beam lead diodes, are mounted on the substrate 122 of high thermal conductance. The substrate is in thermal contact with the copper heat sink 133 through which a liquid refrigerant, such as nitrogen, is introduced. This will cool the mixer with a resultant reduction in conversion loss at Kaband from about 3 db at room temperature to 1 db at 77° K. This improvement in sensitivity is essential for applications where the achievable performance may be limited by the "front-end" sensitivity. Since the mixer diode substrate is thermally isolated from the housing and the exposed cooled volume is either evacuated or filled with an inert gas, there will be no condensation of moisture. For other applications which do not require cooling to as low a temperature, cooling may be accomplished by a multistage Peltier cooler to 200° K.

The inventions described above find wide utility. The technique is not limited to mixer circuits but may be used with any active device using beam-lead discrete components mounted on a substrate or implanted therein. This could include circuits such as frequency doublers, frequency converters, limiters, and parametric amplifiers. The technique has application to both conventional waveguide structures and to planar fin-line structures as described herein. The hermetically sealed modular structure protects from environmental contaminants which could penetrate the limited passivation allowable without performance degradation at millimeter frequencies. The relatively fragile beam-lead diodes are protected against damage in handling and assembly. Effects of moisture condensation due to changing humidity conditions are isolated from the diode junctions. The assembly is generally field replaceable and adaptable to unitary testing. The invention is readily adaptable to operation at cryogenic temperatures with attentant performance improvement. The further advantages of the planar fabrication techniques as disclosed herein provide additional advantages in low cost, accuracy of reproduction, reduction in size and weight, increased bandwidth, and reduced transmission losses.

While the invention has been described in its preferred embodiments, it is to be understood that the words which have been used are words of description rather than of limitations and that changes within the purview of the appended claims may be made without departing from the true scope and spirit of the invention in its broader aspects.

I claim:

1. A hermetically sealed integrated circuit, comprising:
   first and second dielectric substrate means spaced apart, at least portions thereof transparent to incident radio frequency energy,
   conductive frame means having an aperture disposed therein for transmittal of said incident radio frequency energy and means for supporting said first and second dielectric substrate means in parallel planes,
   conductive layer means disposed on said first substrate means within said aperture, for receiving said radio frequency energy incident upon said first or second substrate means,
   at least one discrete component coupled to said conductive layer means and disposed between said spaced substrates for interacting with said energy at a first radio frequency, and
   means for sealing said first and second dielectric substrate means to said frame means to provide a hermetically sealed chamber enclosing said component.

2. A circuit as set forth in claim 1, said discrete component means further comprising diode means.

3. A circuit as set forth in claim 2, said first and second dielectric substrate means further comprising quartz.

4. A circuit as set forth in claim 3, wherein said chamber is evacuated.

5. A circuit as set forth in claim 4, wherein said chamber is filled with an inert gas.

6. A circuit as set forth in claim 5, further comprising:
   hollow conductive guide means having a first port for propagation of radio frequency energy at a first frequency, adapted to operate in a mode having a transverse electric field component,
   said frame means aligned longitudinally along said guide parallel to said electric field component,
   said frame means having longitudinal edges electrically connected to corresponding walls of said guide, and transverse edges electrically defining proximal and distal shunt inductances across corresponding walls of said guide,
   said conductive layer means having a first region proximate to said first port defining a first inductance and phase angle which when reflected to said first port and coupled to said proximal shunt inductance offers a matching impedance to said energy at said first frequency,
   said electric field component incident on said first region of said conductive layer means.

7. A circuit as set forth in claim 6, wherein:
   said guide means further comprises a second port for propagation of radio frequency energy at a second frequency, adapted to operate in a mode having a transverse electric field component,
   said conductive layer means having a second region coupled to said second port electrically defining an inductance coupled to at least a portion of said distal shunt inductance of said frame, thereby comprising an auto transformer for matching said radio frequency energy at said second frequency to said discrete components,
   said electric field component at said second frequency incident on said second region of said conductive substrate, and
   said component also interacting with said second frequency.

8. A circuit as set forth in claim 7, further comprising contact means coupled to said conductive layer to extract said interacted energy.

9. A circuit as set forth in claim 5, further comprising:
   hollow conductive guide means for propagation of radio frequency energy at a first frequency adapted to operate in a mode having a transverse electric field component,
   said guide means defining a U-shaped bend having a portion for receiving said energy,
   said bend including a substantially linear region at its apex for accepting said frame means therein, said frame means aligned in a plane parallel to said linear region and to said electric field component,
   said frame means having a periphery engaging said guide means in electrical contact along said periphery.

10. A circuit as set forth in claim 9, said guide means further comprising means for propagating a second radio frequency, said component also interacting with said second radio frequency, and contact means coupled to said conductive layer means for extracting at least a portion of said interacted energy.

11. A circuit as set forth in claim 1, further comprising first contact means disposed on said first substrate means for coupling a source of energy at a second radio frequency to said component for interacting with said first radio frequency.

12. A circuit as set forth in claim 11, further comprising second contact means distally disposed from said first contact means on said first substrate means and coupled to said component for extracting at least a portion of said interacted energy from said component.

13. A circuit as set forth in claim 12 further comprising:
  guide block means for receiving said frame means containing window means, waveguide means for propagating radio frequency energy of a first frequency.

14. A circuit as set forth in claim 13, wherein said guide block means additionally comprises second waveguide means for propagating radio frequency energy of a second frequency therethrough, said component also interacting with said second radio frequency.

15. A circuit as set forth in claim 14, further comprising:
  substrate support block means engaged in contact with said guide block means and said conductive frame means, including first and second resonant cavities respectively tuned to said first and second frequencies, and aligned with said first and second waveguide means, respectively,
  further dielectric substrate means disposed over said support block and having a portion in contact with and in registration with said second waveguide means,
  further conductive layer means disposed on said further dielectric substrate means, including a first area having probe means for coupling said radio frequency energy of said second frequency to said second cavity and to said at least one discrete component,
  said further conductive layer means including a second area having circuit means to extract at least a portion of said interacted energy, and
  third and fourth contact means disposed on said further dielectric substrate means in registration with said first and second contact means, respectively, for electrical contact to said first conductive layer means.

16. A circuit as set forth in claim 15, in which said conductive layer means are disposed transverse to the direction of propagation of said radio frequency energy at said first and second frequencies.

17. A hermetically sealed integrated circuit, adapted for low temperature operation, comprising:
  dielectric window means having at least a portion transparent to radio frequency energy,
  first electrically conductive layer means spaced apart from said dielectric window means, and aligned to receive electromagnetic energy incident thereto at a first radio frequency,
  thermally conductive dielectric substrate means having first and second opposing faces, said first electrically conductive layer means disposed on said first face and in thermal contact therewith, said thermally conductive dielectric means responsive to cooling means,
  at least one discrete component coupled to said first electrically conductive layer means for interacting with said first radio frequency, in thermal contact with said thermally conductive substrate means so that heat generated by said component is disposed to transfer to said substrate,
  second electrically conductive layer means disposed on said second face of said thermally conductive dielectric means spaced for reflecting a portion of said first radio frequency energy incident thereon, said reflected energy being redirected to said first electrically conductive layer,
  thermally conductive heat sink means in heat transfer relationship with said thermally conductive substrate for extracting heat from said substrate, disposed between said second electrically conducting layer means and thermal insulating means,
  said thermal insulating means disposed between said heat sink means and support block means, for thermally isolating said support block means from said heat sink means and said at least one discrete component,
  said support block means having recesses for receiving said dielectric window means, said thermally conductive substrate with said first and second electrically conductive layer means disposed thereon, said heat sink means, and said thermal insulating means, and
  means for gas-tight sealing said support block means and said dielectric substrate means, thereby enclosing said component in a hermetically sealed chamber,
  said cooling means comprising means for circulating a refrigerant fluid in heat transfer relationship with said heat sink means and said thermally conductive dielectric substrate means whereby heat transferred from said component to said heat sink means is withdrawn by the refrigerant fluid.

18. The circuit as set forth in claim 17, wherein said chamber is evacuated.

19. The circuit as set forth in claim 17, wherein said chamber is filled with an inert gas.

20. The circuit as set forth in claim 19, wherein said dielectric window means comprises quartz.

21. The circuit as set forth in claim 20, wherein said thermally conductive substrate means comprises alumina.

22. The circuit as set forth in claim 21, further comprising first waveguide means, coupled to said dielectric window means, for propagation of said radio frequency energy at said first frequency.

23. The circuit as set forth in claim 22, further comprising second waveguide means, coupled to said first electrically conductive layer means, for propagating energy at a second radio frquency, said component also interacting with said second radio frequency.

24. The circuit as set forth in claim 23, in which first electrically conductive layer means is disposed transverse to the direction of propagation of said radio frequency energy at said first frequency.

25. The circuit as set forth in claim 24, said component means further comprising diode means.

26. The circuit as set forth in claim 25, further comtprising means for extracting at least a portion of said interacted energy derived from at least one of said first and second frquencies from said component.

27. The circuit as set forth in claim 26, further comprising connector means coupled to said first electrically conductive substrate for extracting a portion of said interacted energy.

* * * * *